United States Patent [19]
Robin et al.

[11] Patent Number: 5,618,737
[45] Date of Patent: Apr. 8, 1997

[54] THERMAL DETECTOR COMPRISING A THERMAL INSULATOR MADE OF EXPANDED POLYMER

[75] Inventors: Philippe Robin, Bourg la Reine; Jean-Marc Bureau, Bures S/Yvette; François Bernard, Les Ulis; Hugues Facoetti, Vincennes, all of France

[73] Assignee: Thomson-CSF, Paris, France

[21] Appl. No.: 389,143

[22] Filed: Feb. 15, 1995

Related U.S. Application Data

[62] Division of Ser. No. 193,741, Feb. 9, 1994, Pat. No. 5,418,365.

[30] Foreign Application Priority Data

Feb. 12, 1993 [FR] France .................. 93 01609

[51] Int. Cl.$^6$ .................................................. H01L 31/18
[52] U.S. Cl. .................. 216/56; 438/55; 438/3; 438/780
[58] Field of Search .................. 437/3; 156/625.1

[56] References Cited

U.S. PATENT DOCUMENTS

| 4,740,700 | 4/1988 | Shaham et al. | 437/3 |
| 4,904,608 | 2/1990 | Gentner et al. | 437/3 |
| 5,039,620 | 8/1991 | Yamazaki et al. | 437/3 |

*Primary Examiner*—R. Bruce Breneman
*Attorney, Agent, or Firm*—Oblon, Spivak, McClelland, Maier & Neustadt, P.C.

[57] ABSTRACT

A thermal detector with a monolithic structure comprises a layer of material sensitive to infrared radiation and an insulating layer constituted by a thermostable polymer that can be deposited as a thin layer and has a microporous structure. This insulating layer enables the thermal decoupling of the sensitive layer from the substrate comprising reading circuits with which the detector is provided. The performance characteristics of currently used monolithic infrared detectors can thus be substantially improved through the notable reduction of the thermal losses in the sensitive layer. This is achieved through the greatly reduced thermal conductivity of the layer of dielectric polymer. Application to infrared imaging devices.

14 Claims, 2 Drawing Sheets

5,618,737

THERMAL DETECTOR COMPRISING A THERMAL INSULATOR MADE OF EXPANDED POLYMER

This is a division of application Ser. No. 08/193,741 filed on Feb. 9, 1994 now U.S. Pat. No. 5,418,365.

BACKGROUND OF THE INVENTION

1. Field of the Invention

The present invention relates to the general field of infrared detectors working at ambient temperature and notably to detectors comprising a pyroelectrical material.

There currently exist infrared detectors that can be used to make, in particular, infrared imagers. These detectors work in ambient conditions without any cooling system. To work properly, the sensitive material in the detector is heated by the infrared radiation. The rise in temperature may lead to the appearance of charges (for the pyroelectric detector function), variations in dielectric constant (the dielectric bolometer function) and variations in resistance (the resistive bolometer function). The major problem with these detectors is that of confining the heat within the sensitive material, by the prevention, to the maximum degree, of losses by diffusion within the substrate comprising the circuits for reading the response of the sensitive material.

2. Description of the Prior Art

Different approaches for insulating the sensitive material have already been envisaged. For example, the sensitive element may be attached to the reading circuit by means of conductive epoxy resin pads.

Metallized polyimide pads (U.S. Pat. No. 4,740,700 by Hughes) could also be used as shown in FIG. 1. The method used in both cases is a hybrid method that is difficult or even impossible to implement in batch production. This means that the matrices of detectors are made one by one.

Another approach proposes the use, as a sensitive layer, of pyroelectrical conductors with low conductivity that can be adapted to a less sophisticated level of thermal insulation (Patent FR 89 08799). It is notably proposed to use, for example, a layer of a polyimide type standard dielectric layer, between the silicon reading circuit and the pyroelectric polymer. Thus it becomes possible to reduce losses by diffusion in the sensitive layer, with a microelectronics type of batch production mode, but the performance characteristics and sensitivities of these detectors make it necessary again to consider other approaches in order to further improve the thermal insulation.

SUMMARY OF THE INVENTION

This is why an object of the invention is a thermal detector comprising a layer of material sensitive to infrared radiation, contained between electrodes, a substrate comprising a circuit for the reading of the response of the sensitive material, wherein, between the sensitive material and the substrate, the detector comprises a layer of thermostable material with a microporous structure having reduced thermal conductivity.

The thermostable polymer may advantageously be of the polyimide type.

The sensitive material may advantageously be ferroelectric: it may be a polymer or a ceramic.

The pyroelectric material may advantageously be contained between a continuous electrode and a set of conductive pads arranged in matrix form on the layer of polymer with a microporous structure, so as to define image elements or pixels, the layer of this polymer further comprising conductive vias or via holes connecting the conductive pads to the reading circuit integrated into the substrate.

The sensitive material may also be a thermoresistive material such as an oxide, for example VO2.

An object of the invention is also a method for the making of thermal detectors comprising a substrate and a layer of material sensitive to the infrared radiation, wherein said method comprises the following steps:

the making, on the substrate, of a layer $C_1$ of polymer dissolved in a solvent A, the separation of the layer $C_1$ prompting the appearance of a heterogeneous layer with two phases;

the elimination of the solvent A making it possible to obtain a layer $C'_1$ of polymer having a microporous structure with reduced thermal conductivity;

the making of the layer of sensitive material on said layer $C_2$.

The separation step can also be carried out by thermal treatment at a temperature T1 such that a phase separation appears at this temperature. The solvent of the polymer is then vacuum evaporated at this temperature.

The sensitive material of the layer C2 may be of the pyroelectric polymer type that can easily be deposited as a thin layer. It may notably be a polymer of the polyvinylidene fluoride type or polyvinylene-trifluorethylene fluoride type.

The sensitive material of the layer C2 may also be a ferroelectric ceramic which can be deposited as a thin layer, notably by sol-gel techniques. The value of these manufacturing methods lies in the fact that they use solely thin layer techniques which give small-sized infrared detectors.

Finally, it will be noted that, according to one improvement of the invention, the micropores of the polymer layer are filled not with air but with a substance having better properties of thermal insulation than air, to obtain a layer that is an even greater thermal insulator. Xenon is particularly appropriate: it can easily be incorporated into the layer and remain trapped therein.

BRIEF DESCRIPTION OF THE DRAWINGS

The invention will be understood more clearly and other advantages will appear from the following description, given on a non-restrictive basis and made with reference to the appended figures, of which.

MORE DETAILED DESCRIPTION

Figure 1:
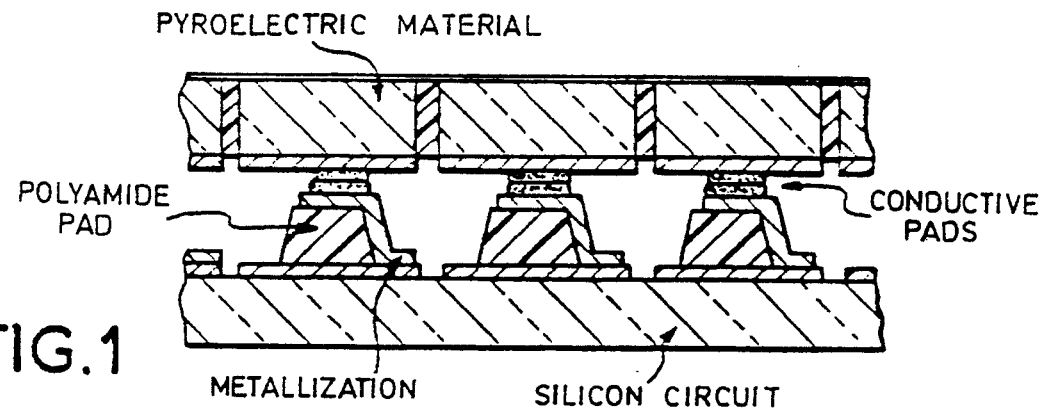
FIG. 1 illustrates a prior art thermal detector having conductive pads that enable the thermal decoupling of the sensitive material from the reading substrate.

FIG. 1 shows an infrared detector based on pyroelectrical material according to the above-mentioned Hughes patent application. This detector comprises elements made of pyroelectric material, at a rate of one element per pixel, between a continuous electrode and elementary electrodes. Conductive pads electrically connect the elementary electrodes to the inputs of processing circuits prepared on a semiconductor substrate. This type of hybrid structure remains far more complex than the structures that are made solely by using thin-layer batch processing techniques such as those used in microelectronics. This is why the invention proposes a thermal detector in which the use of a thermostable material that can be deposited in a thin layer and that has a notably reduced level of thermal conductivity, enables the making of a structure in which a thin layer of sensitive material is made on a substrate comprising a reading circuit, said layer being thermally decoupled from the substrate by a layer of thermostable material.

The substrate used may advantageously be a silicon type semiconductor substrate comprising reading circuits. In the case of matrix detectors that are useful in infrared imaging, the substrate may comprise processing circuits and a 2D matrix of reading switches.

The thermal detector according to the invention comprises a layer constituting the thermal barrier, this layer being provided with conductive vias that enable the electrical contacts to be set up between the elements of the reading circuit and the lower electrodes of the layer of sensitive material whose physical variations in the course of a temperature variation have to be recorded.

Preferably, the layer constituting the thermal barrier is a layer of polyimide type thermostable polymer. This layer may be got from a solution by a standard coating method (by spraying, centrifugation, film-casting, etc.). It is advantageously possible to use a solution of polyimide type precursor of polymer (polyimide being difficult to dissolve) that is conventionally used to make insulating layers in microelectronics.

Before this solution is dried, the so-called phase-separation or phase-inversion technique is used. The aim of this technique is the conversion, in this layer, of the solution, which is initially homogeneous, into a two-phase system that can be used to obtain a polymer-rich phase that, after drying, will constitute a solid structure and a polymer-depleted phase that will constitute a porous structure. This complex structure thus leads to the preparation of a polymer with a microporous structure whose thermal conductivity is notably lowered, after evaporation of a solvent of the initial solution containing the thermostable polymer.

Several methods may be implemented to carry out this phase-inversion technique. Preferably, the phase-inversion operation may be done by coagulation of the solution by immersing it a bath that is not a solvent of polymer but is miscible with the solvent of said solution.

After the elimination of the solvent and of the non-solvent by drying and after thermal treatment to stabilize the structure notably in the case of a precursor of polyimide to be "imidized", there is obtained an expanded polymer whose microporous structure gives it low density and hence reduced thermal conductivity. The layer thus obtained may typically have a thickness ranging from one micron to some hundreds of microns.

To obtain proper adhesion of the porous layer to the substrate, especially during the coagulation phase, it is possible to use a clinging layer C0 or a promoter of adhesion. In this particular case, it may be polyimides, aminosilanes or aluminium chelate. It is also possible, prior to the deposition of the polymer layer which will be made porous, to make a fine polymer layer (preferably the same one) that is dried but is not totally annealed so that it can be allied with this layer during the final thermal treatment.

In order to ensure the imperviousness and the proper surface condition of the porous layer, it is possible to densify a surface zone C'1a by subjecting the upper face of the deposit to a summary drying before the phase-inversion step. This summary drying is done by setting up a temperature gradient within the layer. To this end, it is possible to send a gas flow superficially, or to deposit the substrate covered with the layer within a stove, the substrate/layer unit lying on a cooled plate, to ensure the necessary temperature gradient inside the layer. The etching of the connection vias can be done similarly to the etching of the standard polymers used in microelectronics. The technique used may be plasma etching or photo ablation by excimer laser. It suffices thereafter to deposit metallizations locally in order to set up contacts between the reading circuits and the lower electrodes of the sensitive layer. It may be noted that the cellular structure of the thermally insulating layer enables it to be etched at a speed which is higher than that of the same polymer in a non-expanded state. This thus enables the making of layers with a greater thickness while at the same time keeping the same etching method.

Example of the manufacture of a thermal detector according to the invention, based on ferroelectric material To a silicon substrate comprising reading circuits, there is applied a first thin layer of polyamic acid solution (for example the material referenced PIQ 13 HITACHI) which is a polyimide precursor dissolved in the solvent A, namely N Methyl-Pyrrolidone by spin-coating centrifugation. The dilution of the solution and the speed of centrifugation are adjusted in order to obtain a final thickness of the order of 0.5 µm. This layer is then dried for 10 minutes at 200° C. and constitutes a catching layer C0 on the substrate (S). On this layer, the layer designed to be expanded is deposited. The solution is then more concentrated and the centrifugation speed is reduced to obtain a greater thickness (of the order of 10 µm).

In order to densify the surface zone C'1a of this layer, the solvent A is evaporated summarily on the surface of the deposit in a stove ventilated at 80° C. for two minutes.

The phase inversion is then obtained by plunging the substrate covered with the capturing layer and the partially densified layer into a quantity of non-solvent B while stirring. This non-solvent may be methanol or a chlorinated solvent that is miscible with N-Methyl Pyrrolidone. At the end of some minutes, the originally transparent layer becomes totally diffusive during the separation of the medium into two phases.

Figure 2:
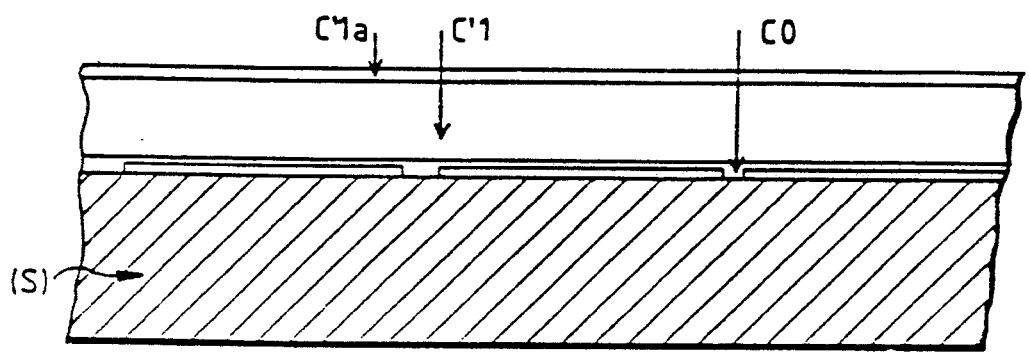
FIG. 2 illustrates a step of a method for the making of thermal detectors according to the invention, leading to the obtaining of a porous layer of expanded polymer deposited on a substrate comprising a reading circuit.

To eliminate the solvent A and the non-solvent B, the layer is vacuum-dried and then processed thermally at 300° C. to convert the polyamic acid into polyimide. The layer C'1 and a structure illustrated in FIG. 2 are then obtained.

Figure 3:
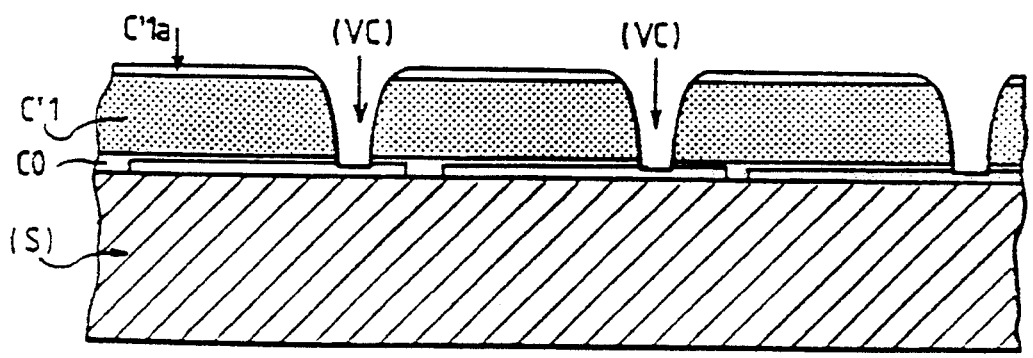
FIG. 3 illustrates a step in the making of connection vias through the porous layer, in the method for the making of a thermal detector according to the invention.

The connection vias (VC) are then etched into this layer of expanded polymer to gain access to the reading elements as illustrated in FIG. 3, by reactive ion etching.

Figure 4:
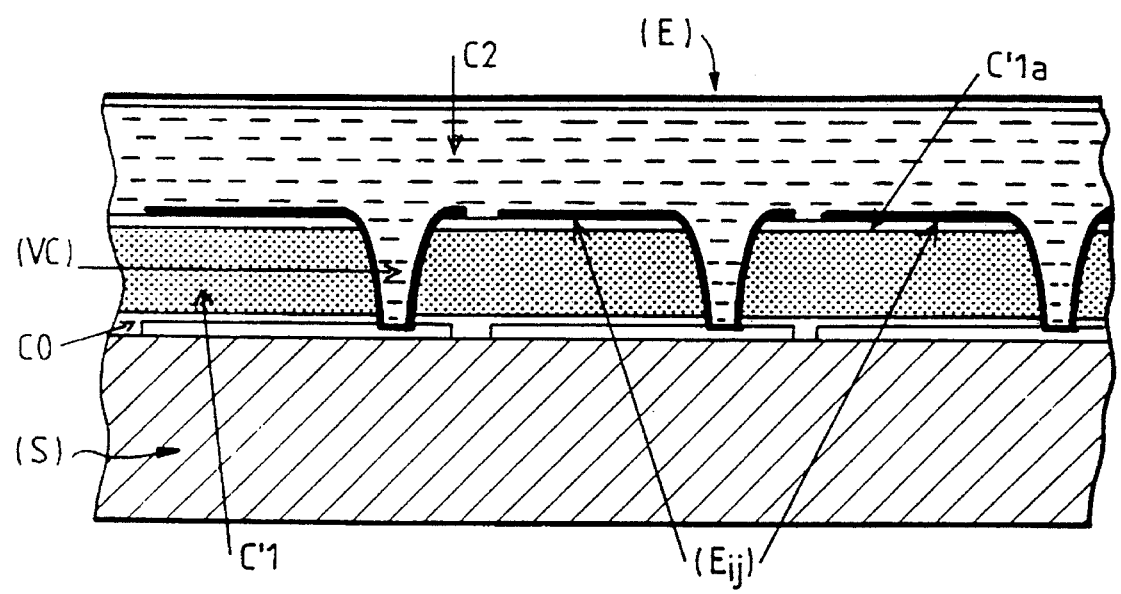
FIG. 4 exemplifies a thermal detector according to the invention, comprising a layer of ferroelectric polymer.

Then the metallization of the vias is carried out, followed by the etching, by photolithography, of the zones in which it is sought to eliminate the metallizations so as to define a matrix arrangement of the lower electrodes (Eij) of the thermal detector, said electrodes being thus disconnected from one another and being connected to the reading circuit of the substrate (S) as can be seen in FIG. 4. On these electrodes (Eij), there is then deposited the layer of sensitive material, for example a layer of pyroelectrical polymer with reduced thermal conductivity: for example, a copolymer PVDF-TrFE 75–25 (75% in moles of PVDF for 25% in moles of TrFE) in dimethylformamide (DMF). Several layers of pyroelectrical polymer can thus be deposited by centrifugation to obtain a thickness of five to several tens of microns.

On this layer, there is then deposited a continuous electrode (E) to constitute a counter-electrode, for example in the form of an aluminium layer with a thickness of 1000 Angstroms, the deposition being done by vacuum evaporation.

A final infrared absorbent layer (A) may then be deposited on the continuous electrode (E): this layer may notably be aluminium black obtained by evaporation of aluminium under nitrogen atmosphere according to a known technique.

The continuous layer (E) may also fulfil the function (A) by being made of metal of the titanium or chromium type.

After the pyroelectric polymer material has been polarized, typically with a DC electrical field in the region of 100 V/μm, the thermal detector thus obtained is capable of working.

The performance characteristics of a detector such as this have been compared with those of a detector made of a pyroelectric polymer film deposited on an insulating layer of dense polyimide.

With a self-supported film of ferroelectric polymer having a thickness of 10 μm, a measurement is made of a pyroelectric current assigned a standardized value of 1 under the effect of a 10. μm $CO_2$ laser radiation at a frequency of 50 Hz.

For a 10 μm film of ferroelectric polymer deposited on a dense polyimide film with a thickness of 20 μm, the measured pyroelectric current drops to 0.4 in terms of the standardized value.

For a 7 μm film of ferroelectric polymer (hence one that is less thick and generates fewer pyroelectric charges) deposited on a porous-structured, expanded polyimide film with a thickness of 14 μm, the pyroelectric current measured is in the region of 0.95 in terms of the standardized value. This is a very conclusive result with respect to the thermal insulation conferred by the porous-structured dielectric layer.

To further improve the properties of thermal insulation of the microporous layer according to the invention, it may be planned to fill the micropores of the layer not with air but with a substance that has a higher heat insulation coefficient than that of air. The substance may be liquid or gaseous. For example, the pores may be filled with xenon which is a better heat insulator than air. Xenon gets placed in the pores, for example, if solvent-elimination annealing operations are carried out in a xenon atmosphere rather than in under ambient atmospheric conditions. After the formation of the microporous layer, the xenon remains trapped in the pores.

What is claimed is:

1. A method for the making of a thermal detector comprising a substrate and a layer of material sensitive to infrared radiation, wherein said method comprises the following steps:

the making, on the substrate, of a layer $C_1$ of polymer dissolved in a solvent A, the separation of the layer $C_1$ prompting the appearance of a heterogeneous layer with two phases;

the elimination of the solvent A to obtain a layer $C'_1$ of polymer having a microporous structure with reduced thermal conductivity;

the making of the layer of sensitive material on said layer $C'_1$.

2. A method for the making of a thermal detector according to claim 1, wherein the separation step is carried out by the immersion of the layer $C_1$ on the substrate, in a product B that is not a solvent of the polymer and is miscible with the solvent A.

3. A method for the making of a thermal detector according to claim 2, wherein the elimination of the solvent A is done simultaneously with that of the product B, by thermal treatment.

4. A method according to claim 3, wherein the thermal treatment is done in an atmosphere of a gas having thermal insulation properties that are better than those of air, so as to fill the micropores that get formed in the layer of polymer with this gas.

5. A method according to claim 4, wherein the gas is xenon.

6. A method for the making of a thermal detector according to any of the claims 1 to 5, wherein the polymer dissolved in the solvent A is a polyimide precursor.

7. A method for the making of a thermal detector according to claim 5, wherein the step for the elimination of the solvent A is followed by a thermal treatment at high temperature so as to convert the precursor into polyimide.

8. A method for the making of a thermal detector according to one of the claims 6, wherein the polymer is polyamic acid dissolved in N-Methyl Pyrrolidone.

9. A method for the making of a thermal detector according to one of the claims 7, wherein the product B is methanol.

10. A method for the making of a thermal detector according to one of the claims 1 to 5, wherein the sensitive material of the layer C2 is a polymer of the polyvinylidene fluoride or polyvinylene-trifluorethylene fluoride type.

11. A method for the making of a thermal detector according to one of the claims 1 to 5, wherein the obtaining of the layer $C_2$ is followed by a step for the making of connection via holes, by etching.

12. A method for the making of a thermal detector according to claim 11, wherein the making of the connection via holes is followed by a step of metallization, and then a step of photolithography to define discrete electrodes above the layer C2.

13. A method for the making of a thermal detector according to one of the claims 1 to 5, wherein a continuous electrode is deposited on the layer of sensitive material.

14. A method for the making of a thermal detector according to one of the claims 1 or 2, wherein the micropores that get formed in the polymer layer are filled with a substance having a higher thermal insulation coefficient than that of air.

* * * * *